(12) United States Patent
Li et al.

(10) Patent No.: US 9,941,784 B1
(45) Date of Patent: Apr. 10, 2018

(54) POWER FACTOR CORRECTION CURRENT SENSE WITH SHUNT SWITCHING CIRCUIT

(71) Applicant: PAI Capital LLC, Santa Clara, CA (US)

(72) Inventors: Jun Li, Shenzhen (CN); Vim Tan, Shenzhen (CN)

(73) Assignee: BEL POWER SOLUTIONS INC., Santa Clara, CA (US)

( * ) Notice: Subject to any disclaimer, the term of this patent is extended or adjusted under 35 U.S.C. 154(b) by 0 days.

(21) Appl. No.: 15/046,640

(22) Filed: Feb. 18, 2016

Related U.S. Application Data

(60) Provisional application No. 62/249,488, filed on Nov. 2, 2015.

(51) Int. Cl.
*H02M 1/42* (2007.01)
*G01R 15/18* (2006.01)
*H02M 1/00* (2006.01)

(52) U.S. Cl.
CPC ........ *H02M 1/4208* (2013.01); *G01R 15/183* (2013.01); *H02M 2001/0009* (2013.01)

(58) Field of Classification Search
CPC ........ H02M 1/4208; H02M 2001/0009; G01R 15/183
USPC ............................... 363/21.04, 127; 323/210
See application file for complete search history.

(56) References Cited

U.S. PATENT DOCUMENTS

| | | | | |
|---|---|---|---|---|
| 4,761,727 A | * | 8/1988 | Kammiller | ........ H02M 3/3387 323/358 |
| 6,429,598 B1 | * | 8/2002 | Haley | ........ H05B 39/08 315/141 |
| 7,173,831 B1 | * | 2/2007 | Vogman | ........ H02M 3/33592 363/131 |
| 8,198,874 B2 | * | 6/2012 | Melanson | ........ H02M 3/156 323/222 |
| 9,197,132 B2 | * | 11/2015 | Artusi | ........ H02M 1/4225 |
| 9,431,896 B2 | * | 8/2016 | Ye | ........ H02M 1/4208 |
| 9,577,512 B2 | * | 2/2017 | Wang | ........ H02M 1/42 |
| 9,590,494 B1 | * | 3/2017 | Zhou | ........ G01R 1/203 |
| 9,667,136 B1 | * | 5/2017 | Lin | ........ H02M 1/4208 |
| 2004/0136207 A1 | * | 7/2004 | Havanur | ........ H02M 3/33592 363/21.06 |

(Continued)

OTHER PUBLICATIONS

Received STIC search report from EIC 2800 searcher Samir Patel on Mar. 2, 2017.*

*Primary Examiner* — Timothy J Dole
*Assistant Examiner* — Htet Z Kyaw
(74) *Attorney, Agent, or Firm* — Patterson Intellectual Property Law, P.C.; Mark J. Patterson; Gary L. Montle

(57) ABSTRACT

A power converter is provided with a totem-pole power factor correction (PFC) circuit for bridgeless line rectification, and current sensing circuit that can be selectively disabled to reduce unwanted current sense signal components and undesirable current transformer voltage stresses. The totem-pole PFC has at least a first leg with first and second switching elements coupled in series. A PFC inductor is coupled between an AC input on a first end and a node between the switching elements. The current sensing circuit includes a first transformer winding coupled in series with the first switching element, a second transformer winding magnetically coupled to the first winding and configured to deliver current from the first winding to a current sense terminal during an active phase for the first switching element, and a shunt circuit configured to disable the current sensing circuit during a freewheeling phase for the first switching element.

16 Claims, 14 Drawing Sheets

(56) References Cited

U.S. PATENT DOCUMENTS

| | | | | |
|---|---|---|---|---|
| 2007/0070659 A1* | 3/2007 | Sawtell | ............ | H02M 3/33523 363/21.01 |
| 2008/0130322 A1* | 6/2008 | Artusi | ................ | H02M 1/4225 363/21.01 |
| 2008/0232141 A1* | 9/2008 | Artusi | ................ | H02M 1/4225 363/21.01 |
| 2008/0278975 A1* | 11/2008 | Degen | ............ | H02M 3/33523 363/21.18 |
| 2008/0304291 A1* | 12/2008 | Degen | .............. | H02M 3/33592 363/21.06 |
| 2010/0327838 A1* | 12/2010 | Melanson | ............ | H02M 3/156 323/311 |
| 2011/0205763 A1* | 8/2011 | Artusi | ............... | H02M 1/4225 363/21.06 |
| 2012/0113551 A1* | 5/2012 | Huang | .................. | H02H 5/041 361/18 |
| 2013/0258731 A1* | 10/2013 | Xu | ......................... | H02M 1/08 363/78 |
| 2015/0015071 A1* | 1/2015 | Deboy | ................. | H02M 3/335 307/31 |
| 2015/0180330 A1* | 6/2015 | Ye | ...................... | H02M 1/4208 363/126 |
| 2016/0028304 A1* | 1/2016 | O'Day | ............... | H02M 1/4225 363/89 |
| 2016/0134185 A1* | 5/2016 | Wang | ..................... | H02M 1/42 323/235 |
| 2016/0190938 A1* | 6/2016 | Wang | ............... | H02M 3/33507 363/21.12 |
| 2016/0241132 A1* | 8/2016 | Lin | .................... | H02M 1/4225 |
| 2016/0329819 A1* | 11/2016 | Chen | ................ | H02M 3/33515 |

\* cited by examiner

US 9,941,784 B1

POWER FACTOR CORRECTION CURRENT SENSE WITH SHUNT SWITCHING CIRCUIT

CROSS-REFERENCES TO RELATED APPLICATIONS

This application claims benefit of U.S. Provisional Patent Application No. 62/249,488, filed Nov. 2, 2015, and which is hereby incorporated by reference.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to power factor correction ("PFC") circuits. More particularly, the present invention relates to totem-pole PFC circuits implementing current sense transformers and shunt circuitry to prevent damage from reverse current flow.

Many conventional PFC circuits for AC-DC or AC-AC power converters are configured with a diode bridge rectifier at an input stage, followed by for example a boost circuit. Efficiency for such configurations can be inherently limited, in that there are two diode voltage drops at the input stage and one at the boost stage. This is problematic for prospective designs, as the efficiency requirements for power converters are constantly being pushed higher and higher.

Totem Pole PFC circuits are known in the art for being able to achieve higher efficiency by eliminating the power loss in the input bridge rectifier. As compared to other bridgeless alternatives, the totem-pole PFC configuration uses the fewest components and has the smallest conduction loss.

An exemplary totem-pole PFC configuration 10 as is known in the art may now be described, further by reference to FIG. 1. In a first (e.g., positive) AC line half-cycle, switching element Q4 is turned on for line rectification purposes via PWM signals (e.g., PWM_L) from an associated PWM controller 11, further wherein the AC source (Vac) is connected to the load (RL) return. Switching element Q2 is controlled via PWM_B signals from controller 11 as an active boost switch during this phase, and switching element Q1 freewheels the inductor current into the output capacitor C1 and load RL. During the freewheeling phase for the switching element Q1, the switching element Q1 may also typically be turned on in complementary fashion with respect to the active switching to minimize conduction losses.

In a second (e.g., negative) AC line half cycle, switching element Q3 is controlled via PWM signals (e.g., PWM_H) from the PWM controller 11 to connect the AC source to the output DC bus ($V_{bulk}$) node. In this phase, the switching element Q1 is the active boost switch and switching element Q2 freewheels the inductor current.

Typically, the controller 11 is configured to detect each AC zero crossing and alternate operating modes accordingly. The controller therefore needs to sense at least the input voltage.

Current sense transformers are known in the art for sampling current, but in a totem-pole configuration it may be understood that negative current will pass through the current sense transformer in freewheeling phases (as further described below), creating undesired signals which may further cause abnormal operation in the control circuit 11.

Therefore, Hall sensors have typically been applied in totem-pole PFC topologies to sample current, but they are relatively bulky and costly for most practical power converter applications.

BRIEF SUMMARY OF THE INVENTION

In an embodiment of a power converter as disclosed herein, a totem-pole power factor correction (PFC) circuit is provided for bridgeless line rectification, and a current sensing circuit can be selectively disabled to reduce unwanted current sense signal components and undesirable current transformer voltage stresses. The totem-pole PFC has at least a first leg with first and second switching elements coupled in series. A PFC inductor is coupled between an AC input on a first end and a node between the switching elements. The current sensing circuit includes a first transformer winding coupled in series with the first switching element, a second transformer winding magnetically coupled to the first winding and configured to deliver current from the first winding to a current sense terminal during an active phase for the first switching element, and a shunt circuit configured to disable the current sensing circuit during a freewheeling phase for the first switching element.

In one aspect, circuitry as disclosed herein may avoid disruptive voltages on the current sense transformer during reverse current flow, which otherwise may damage or malfunction with the control circuit.

In another aspect, such circuitry allows the use of a lower cost magnetic part as compared to a Hall sensor.

In another aspect, the aforementioned current sensing circuit may be defined as a first current sensing circuit, with the power converter further including a third transformer winding coupled in series with the second switching element, a fourth transformer winding magnetically coupled to the third winding and configured to deliver current from the third winding to a current sense terminal during an active phase for the second switching element, and a shunt circuit configured to disable the current sensing circuit during a freewheeling phase for the second switching element.

In another aspect, an active phase for the first switching element and a freewheeling phase for the second switching element may correspond to a negative half cycle for the AC input, wherein an active phase for the second switching element and a freewheeling phase for the first switching element correspond to a positive half cycle for the AC input.

In another aspect, the shunt circuit may include a shunt switch electrically coupled across the second winding, and a controller configured to activate the shunt switch and accordingly short the transformer during the freewheeling phase for the first switching element.

In one embodiment of such a shunt circuit, first and second shunt switches may be electrically coupled in series across the second winding, and the controller configured to activate each of the first and second shunt switches during the freewheeling phase for the first switching element.

In one aspect of such an embodiment, a voltage source may be applied between a common source node for each of the first and second shunt switches and respective gate nodes for the first and second shunt switches.

In another aspect, the first and second shunt switches may be electrically coupled in series at a common source node, and respective gate terminals for the first and second shunt switches coupled to a collector terminal for a third shunt switch, wherein a collector terminal for a fourth shunt switch is coupled to a base terminal for the third shunt switch and an emitter terminal for the fourth shunt switch is coupled to circuit ground, and wherein the controller is configured to deliver control signals for activating a base terminal for the fourth shunt switch during the freewheeling phase for the first switching element, thereby further activating each of the first, second and third shunt switches.

In another aspect, the first, second, third and fourth shunt switches may be formed in an integrated circuit device.

In still another embodiment, the first and second shunt switches may be electrically coupled in series at a common drain node, and the controller coupled between a circuit ground and respective gate terminals for the first and second shunt switches.

In still another embodiment, the shunt switch may include a relay driven by a coil coupled in series with the controller.

In still another embodiment, the shunt switch may include an opto-coupler having a sensor coupled across the second transformer winding and a source coupled to the controller.

DETAILED DESCRIPTION OF THE INVENTION

Figure 1:
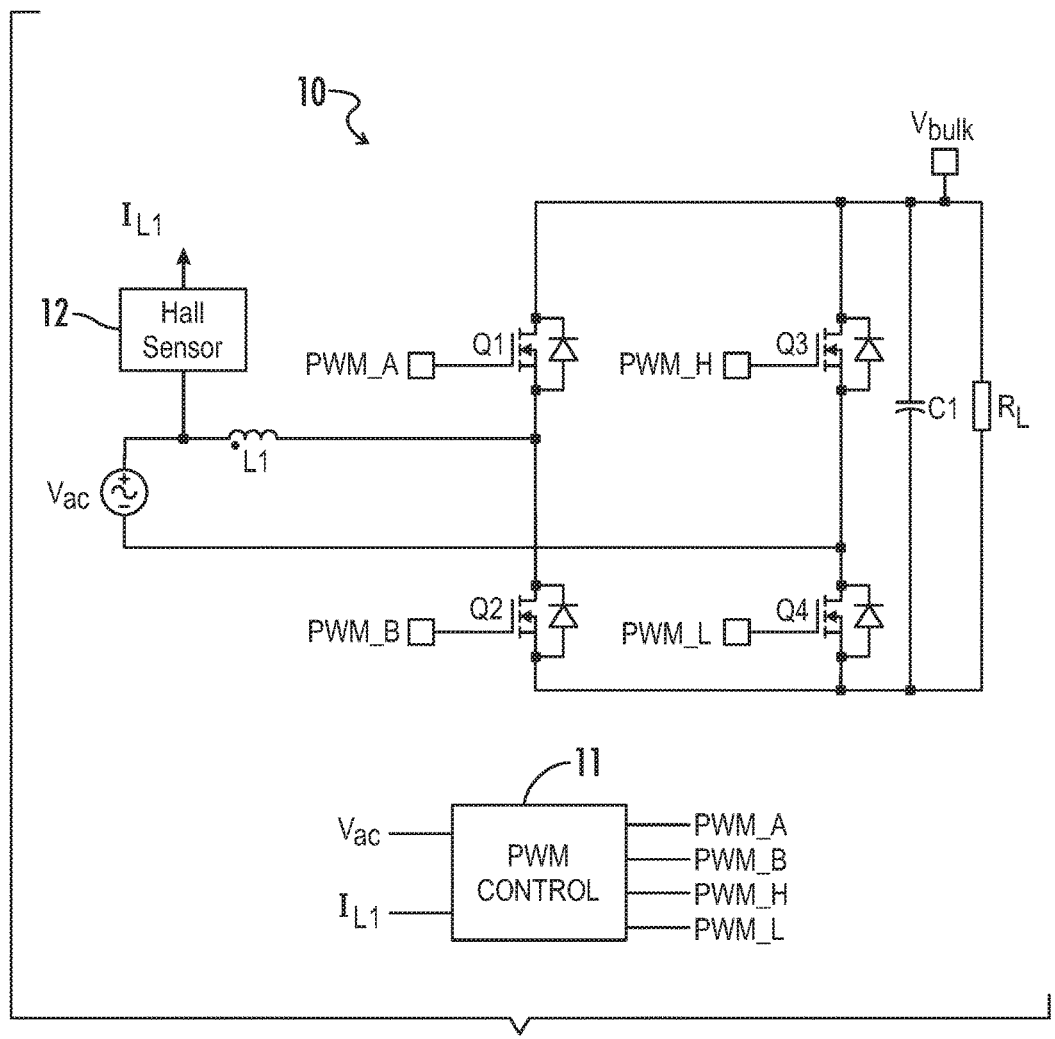
FIG. 1 is a circuit diagram representing an example of a totem-pole PFC circuit as previously known in the art.

Referring generally to FIGS. 2-15, various exemplary embodiments of an invention may now be described in detail. Where the various figures may describe embodiments sharing various common elements and features with other embodiments, similar elements and features are given the same reference numerals and redundant description thereof may be omitted below.

Figure 2:
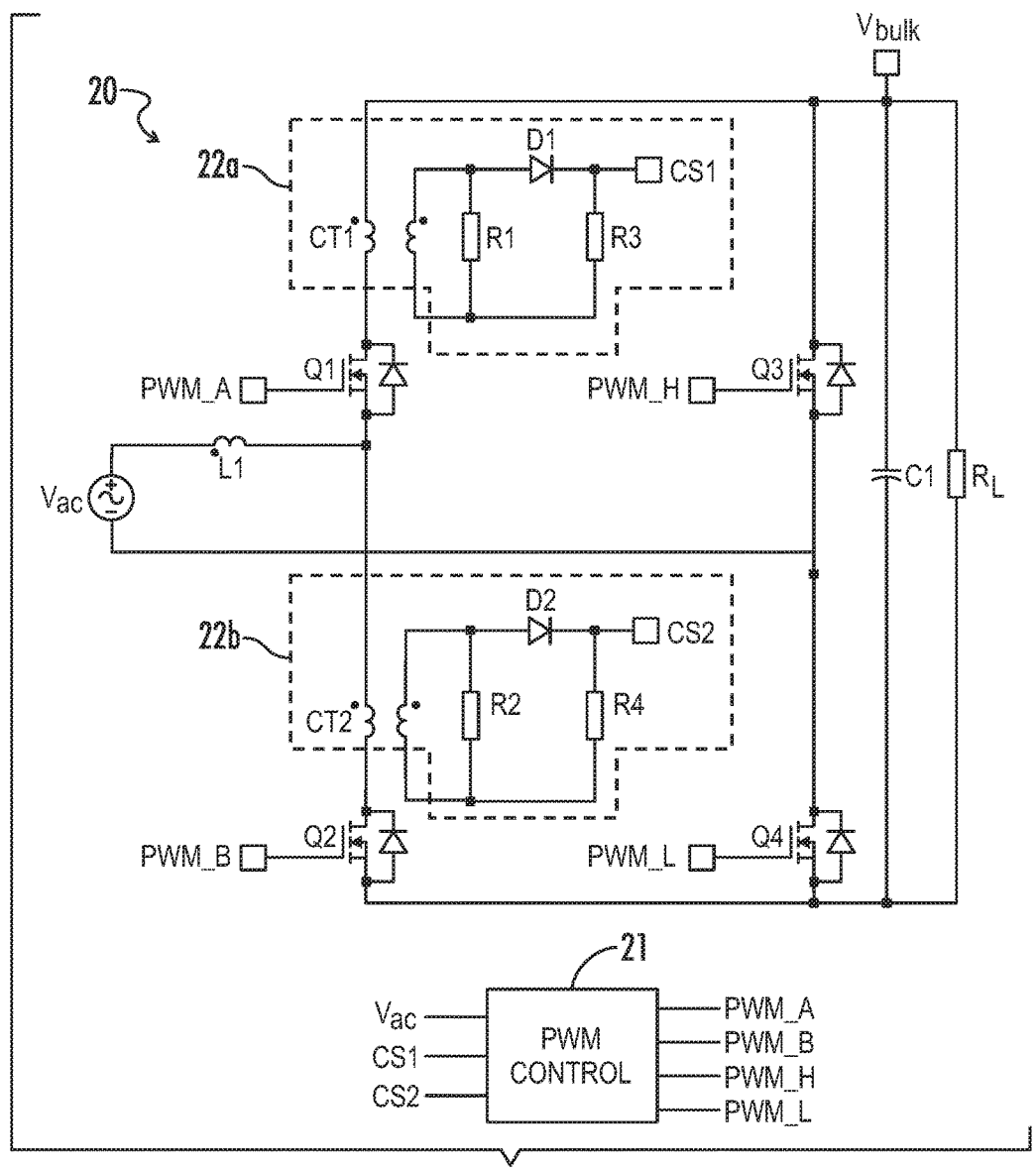
FIG. 2 is a circuit diagram representing an exemplary totem-pole PFC circuit with current sense transformer implementation.
Figure 3:
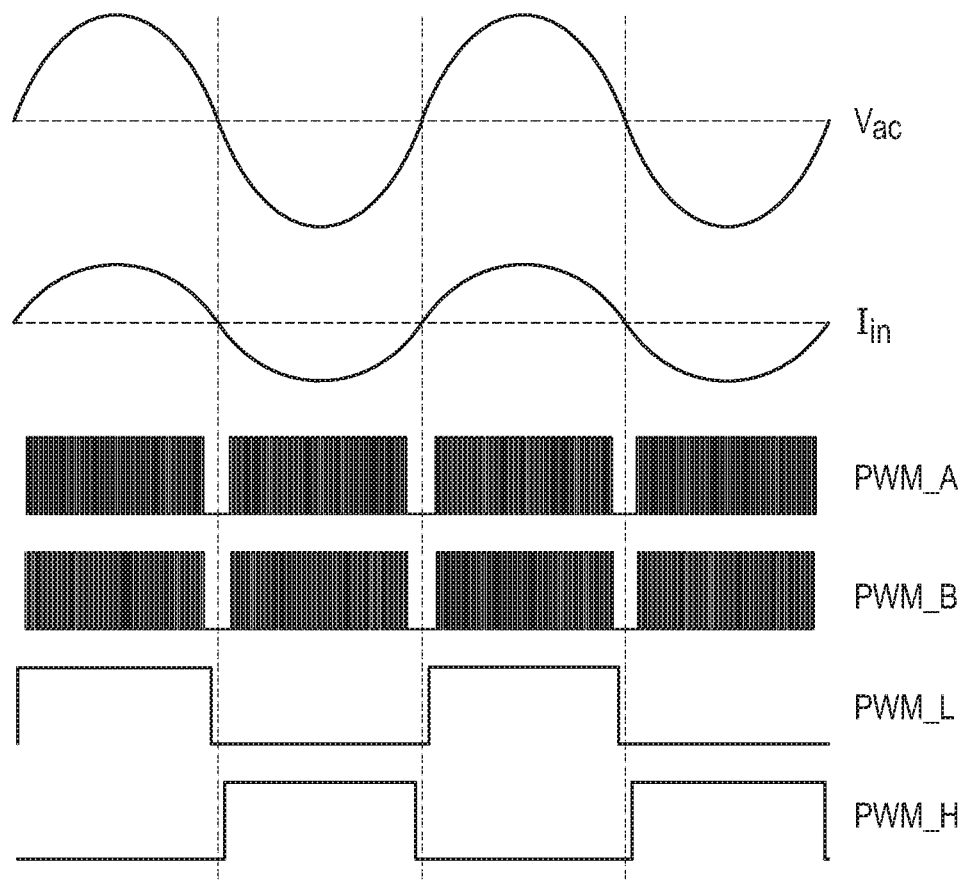
FIG. 3 is a waveform diagram representing relevant driver signals for the switching elements in FIG. 2.

An exemplary totem-pole PFC converter 20 with current sense transformers 22a, 22b, for feedback of sensed current to a PWM controller 21 may be described with reference to FIG. 2. With further reference to FIG. 3, description may further be provided with respect to the timing of relevant drive signals. In the positive AC line half cycle, switching element Q2 is the active boost switch and switching element Q1 is the freewheeling switch. Switching element Q4 is turned on to complete the circuit return. The current signal through switching element Q2 is transferred to current sense signal CS2 via the current sense transformer CT2 and an exemplary circuit formed of diode D2, reset resistor R2 and shunt resistor R4.

Likewise, in the negative AC line half cycle, switching element Q1 is the active boost switch and switching element Q2 is the freewheeling switch. Switching element Q3 is turned on to complete the circuit return. The current through switching element Q1 is represented as current sense signal CS1 and transferred to the control circuit 21 via the current sense transformer CT1 and an exemplary circuit formed of diode D1, reset resistor R1 and shunt resistor R3.

Figure 4A:
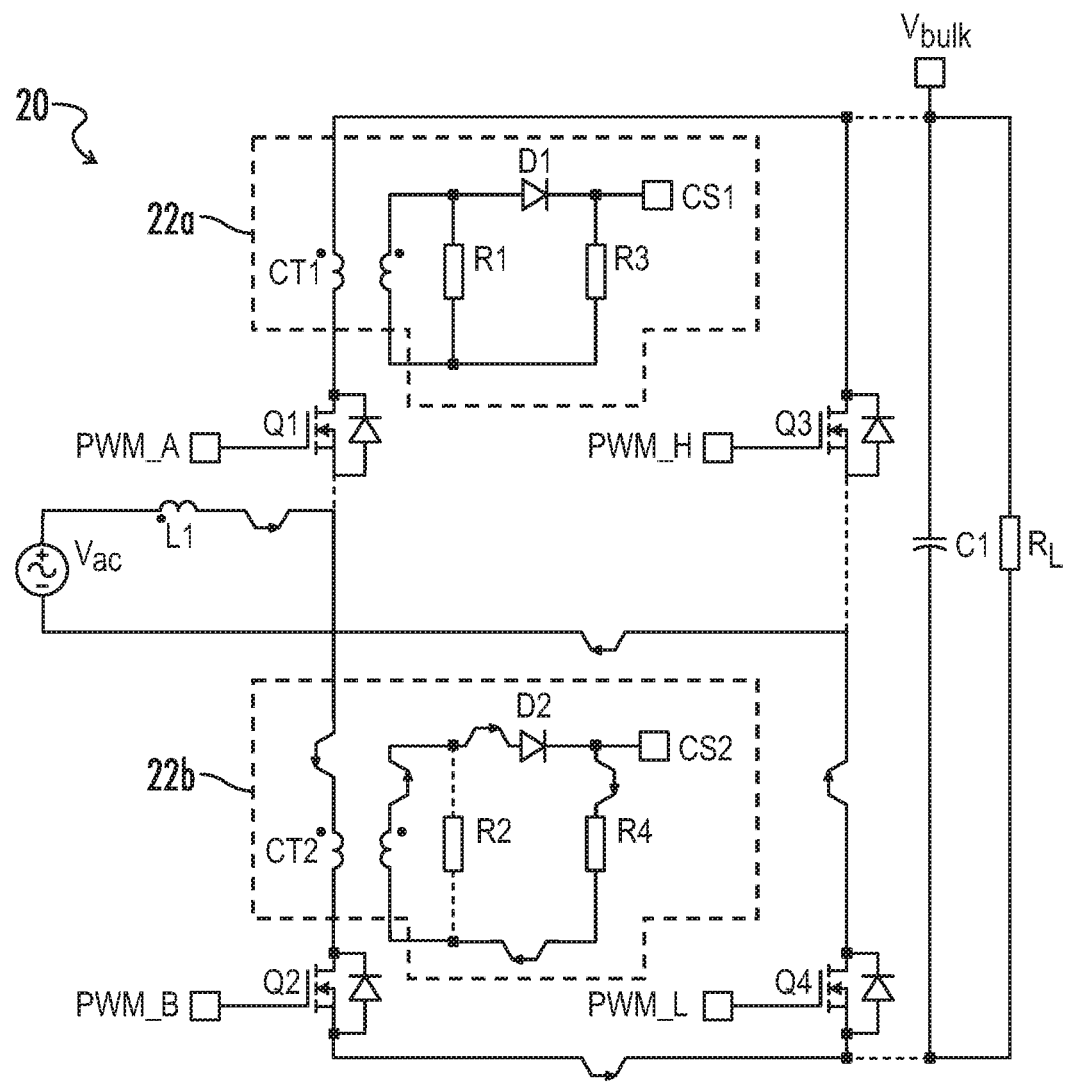
FIG. 4A is a circuit diagram representing operation of the totem-pole PFC circuit of FIG. 2 during a first AC line half cycle.

Referring next to FIG. 4A, it may be demonstrated how a current sense transformer circuit operates with respect to the totem-pole PFC converter, during a positive AC line half cycle, when switching element Q2 is ON and switching element Q1 is OFF. When Q2 is turned on as the active boost switch, the current through Q2 (e.g., from drain to source) is transferred to current sense signal CS2 by the turns ratio of current sense transformer CT2 and resistance of shunt resistor R4, since typically R4<<R2. The PFC controller 21 may use this signal CS2 to calculate the average current through PFC inductor L1.

Figure 4B:
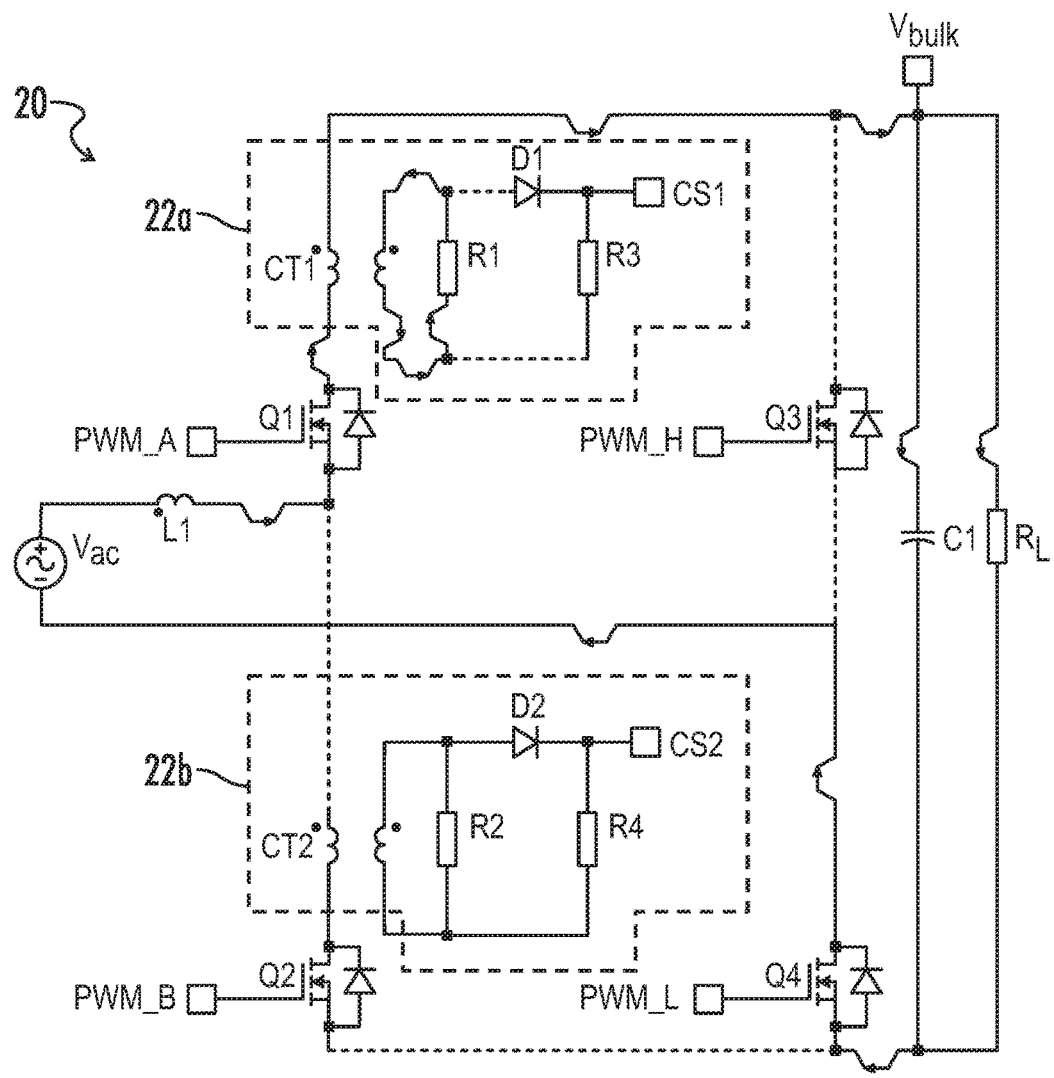
FIG. 4B is a circuit diagram representing operation of the totem-pole PFC circuit of FIG. 2 during a second AC line half cycle.

However, further by reference to FIG. 4B, it may be demonstrated how a problem arises during the positive AC line half cycle when switching element Q2 is turned OFF and the switching element Q1 is turned ON. When Q1 is turned on as the freewheeling switch, the current through Q1 (e.g., from source to drain) is transferred to the secondary stage for the current transformer CT1 as well. As the current direction is reversed, diode D1 causes all current to pass through reset resistor R1. This has the effect of causing a high voltage across the secondary winding for current transformer CT1, since the resistor R1 typically has a large resistance value. This high voltage is repeated in each cycle and saturates the current sense transformer CT1, further causing an unwanted signal component on the current sense terminal CS1 because of CT1 resets through diode D1 and shunt resistor R3.

Figure 5:
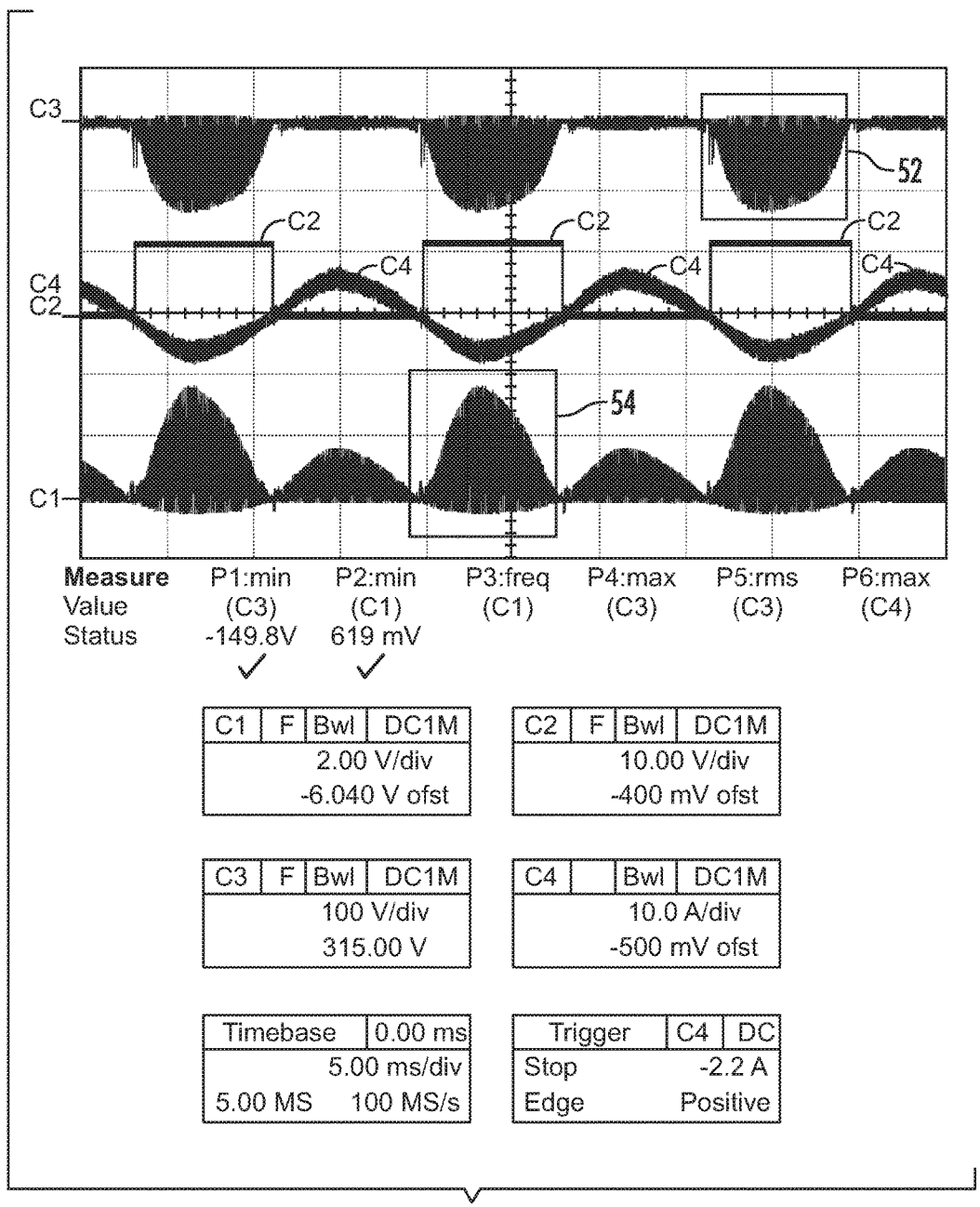
FIG. 5 is a waveform diagram representing measured values during example operation of the circuit from FIG. 2.

Referring to FIG. 5, a waveform is represented for one example of current sense transformer implementation according to FIGS. 4A and 4B in a totem-pole PFC circuit. In the example given, current sense transformers CT1 and CT2 are provided with turns ratios of 1:100; inductance factor ($A_L$) of 2240 nH/T; secondary inductance of 22.4 mH; and an effective magnetic area for the core of 2.65 mm². The reset resistors R1 and R2 have a resistance value of 20 kOhm, while the shunt resistors R3 and R4 are assigned resistance values of 24 Ohm. The switching frequency is applied at 50 kHz.

In the waveform diagram, the current sense signal CS1 is represented as C1; the PWM driver signal PWM_L for switching element Q4 is represented as C2; the voltage across the secondary winding for current sense transformer CT1 is represented as C3; and the current through the PFC inductor L1 is represented as C4.

One of skill in the art may accordingly observe several concerns when an otherwise conventional current sense transformer is implemented in a totem-pole PFC converter. First, a high reverse voltage 52 may be present on the secondary of current sense transformer CT1, so a high voltage rating (e.g., >200V) diode is needed for D1. Further, an unwanted component 54 is presented in current sense signal CS1 (C1) that may cause control system malfunction. Power losses are also provided on the reset resistor R1 that worsen the efficiency of the circuit.

Figure 6:
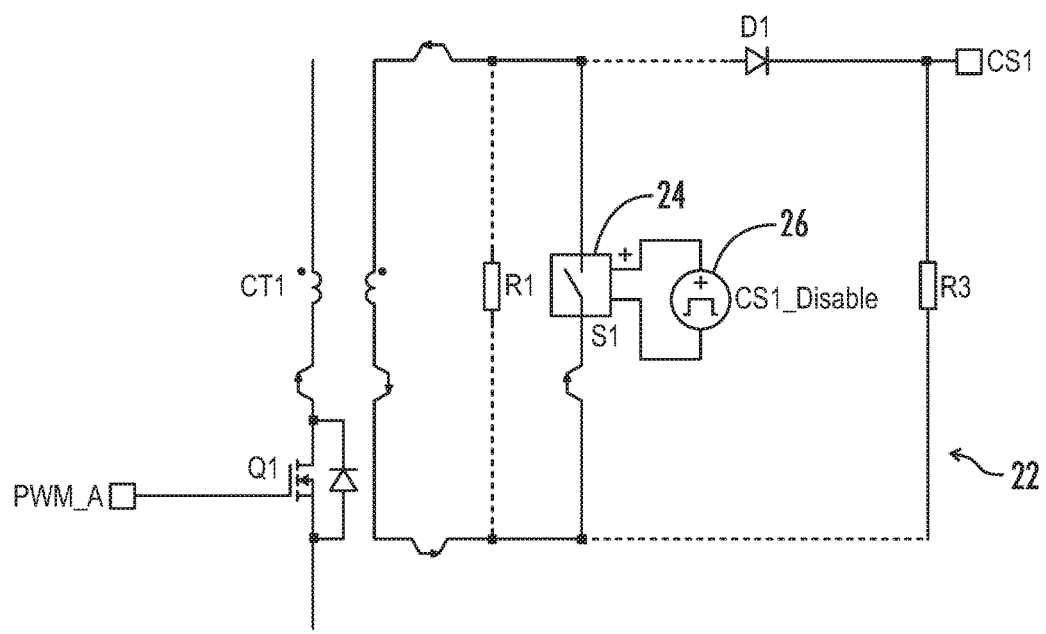
FIG. 6 is a circuit diagram representing a current sense transformer with shunt switch circuit according to an embodiment of the present disclosure.
Figure 10:
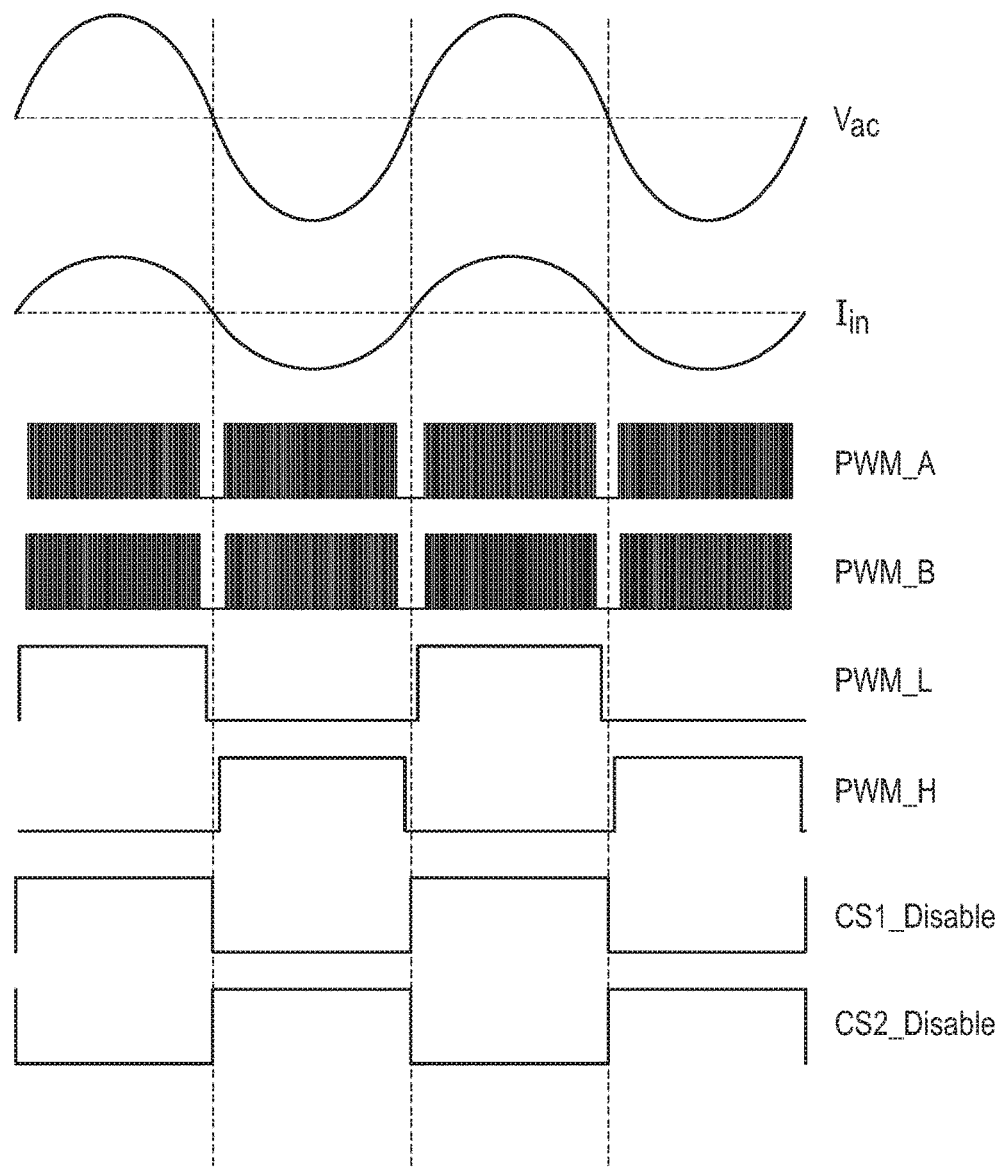
FIG. 10 is a waveform diagram representing input values and driver signals for the PFC totem-pole converter of FIG. 9.

With reference now to FIG. 6, a current sense disabling process is proposed in accordance with various embodiments of the present disclosure to address the aforementioned concerns. A current sense circuit 22 as disclosed herein includes the current sense transformer CT1 coupled on the secondary side with a shunt switch circuit 24 in parallel with and between reset resistor R1 and shunt resistor R3. In the example shown, the shunt switch circuit 24 is composed of a single switch S1, and shunt switch disable signal (CS1_Disable) controls the switch S1. In various embodiments, a shunt switch disable signal may be generated from the PFC controller, in accordance for example with a process as illustrated in FIG. 10, but alternatively may be generated from additional control circuitry or drivers (not shown) without altering the scope of an invention as disclosed herein.

When PFC switching element Q1 is operating as the freewheeling switch in the positive AC line half cycle, the CS1_Disable signal controls the switch S1 to its closed position and hence shorts the current sense transformer CT1 (i.e., disabling the current sense circuit). As this very low impedance path of the switch S1 is provided across the secondary winding, there is a very low voltage across the transformer CT1 that can be neglected.

When PFC switching element Q1 is working as the active boost switch in the negative AC line half cycle, the CS1_Disable signal controls the switch S1 to be open, which allows the current sense circuit 22 to normally sense the current through switching element Q1, in a manner otherwise consistent with conventional current sense implementation.

Figure 7:
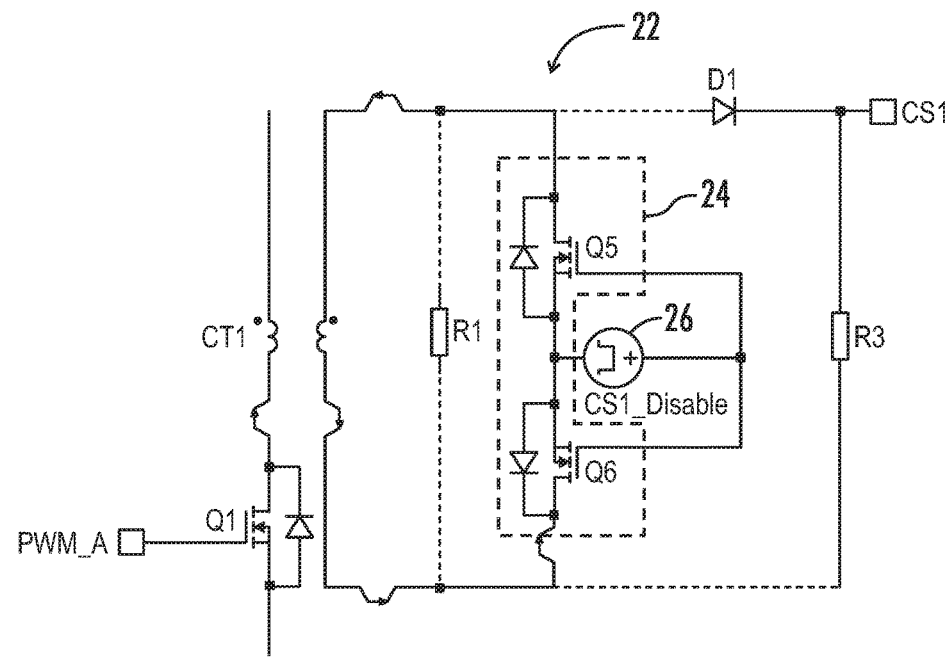
FIG. 7 is a circuit diagram representing another embodiment of a current sense transformer with shunt switch circuit as disclosed herein.

By reference next to FIG. 7, a particular embodiment of a current sense circuit 22 may now be described which further implements the aforementioned shunt switch concept. In this configuration, the shunt switch circuit 24 is defined by switching elements Q5 and Q6 arranged in a common source configuration. Ideally, the transistors would be driven by a voltage source applied between the common source and gate to turn on and off the transistors. However, this would require a floating driver because the common source reference is not coupled to the circuit return path. If a voltage referenced to the return path is used to drive the common source switching elements Q5 and Q6, the drive voltage would need to be lower than approximately −10 volts in order to turn off both switching elements, which may not be particularly practical in an actual circuit.

Figure 8:
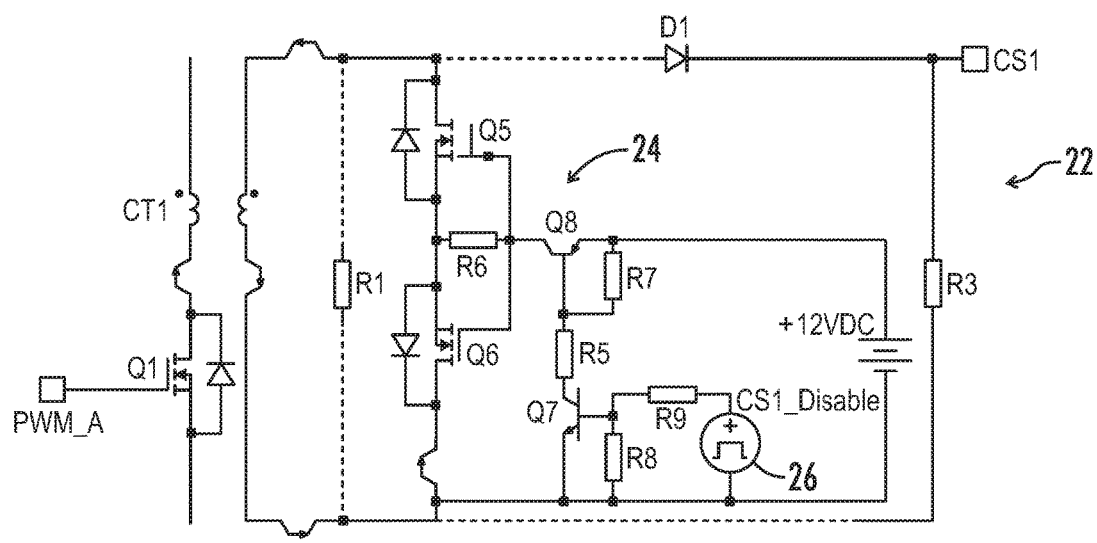
FIG. 8 is a circuit diagram representing another embodiment of a current sense transformer with shunt switch circuit as disclosed herein.

Referring next to FIG. 8, a more practical embodiment of a current sense circuit 22 may be described with a shunt switch circuit 24 having another common source configuration. This embodiment of a shunt switch 24 will cut off gate drive signals to switching elements Q5 and Q6, using gate-source resistor R6 to discharge the gates and achieve a turn off function, with no need for the aforementioned negative voltage to turn off both switching elements. When the CS1_Disable signal 26 is low, additional switching elements Q7 and Q8 are turned off. The gate-source resistor R6 discharges the gates of switching elements Q5 and Q6 and keeps them off. The current sense circuit 22 can normally sense the current through PFC switching element Q1 and a proportional voltage will be established on shunt resistor R3. When the CS1_Disable signal is high, switching elements Q7 and Q8 will turn on and a current through gate-source resistor R6 and the body drain diode of Q6 will flow, establishing a gate-source voltage across Q5 and Q6 and accordingly turning them on. With Q5 and Q6 turned on, the current sense circuit 22 is disabled since a low impedance path is provided across the secondary winding of current transformer CT1, effectively shorting the device. In this condition the transformer CT1 can conduct current in both directions without magnetizing the transformer.

In an embodiment, switching elements Q5 and Q6 may be preferably configured with a small output capacitance Coss to avoid distortion of the current sense CS1 signal.

An embodiment of a totem-pole PFC stage according to the present disclosure may next be described with reference to FIGS. 9-11, the PFC converter 20 having a pair of current sense circuits 22a, 22b with transformers CT1, CT2 and respective shunt switch circuits 24a, 24b.

Figure 11:
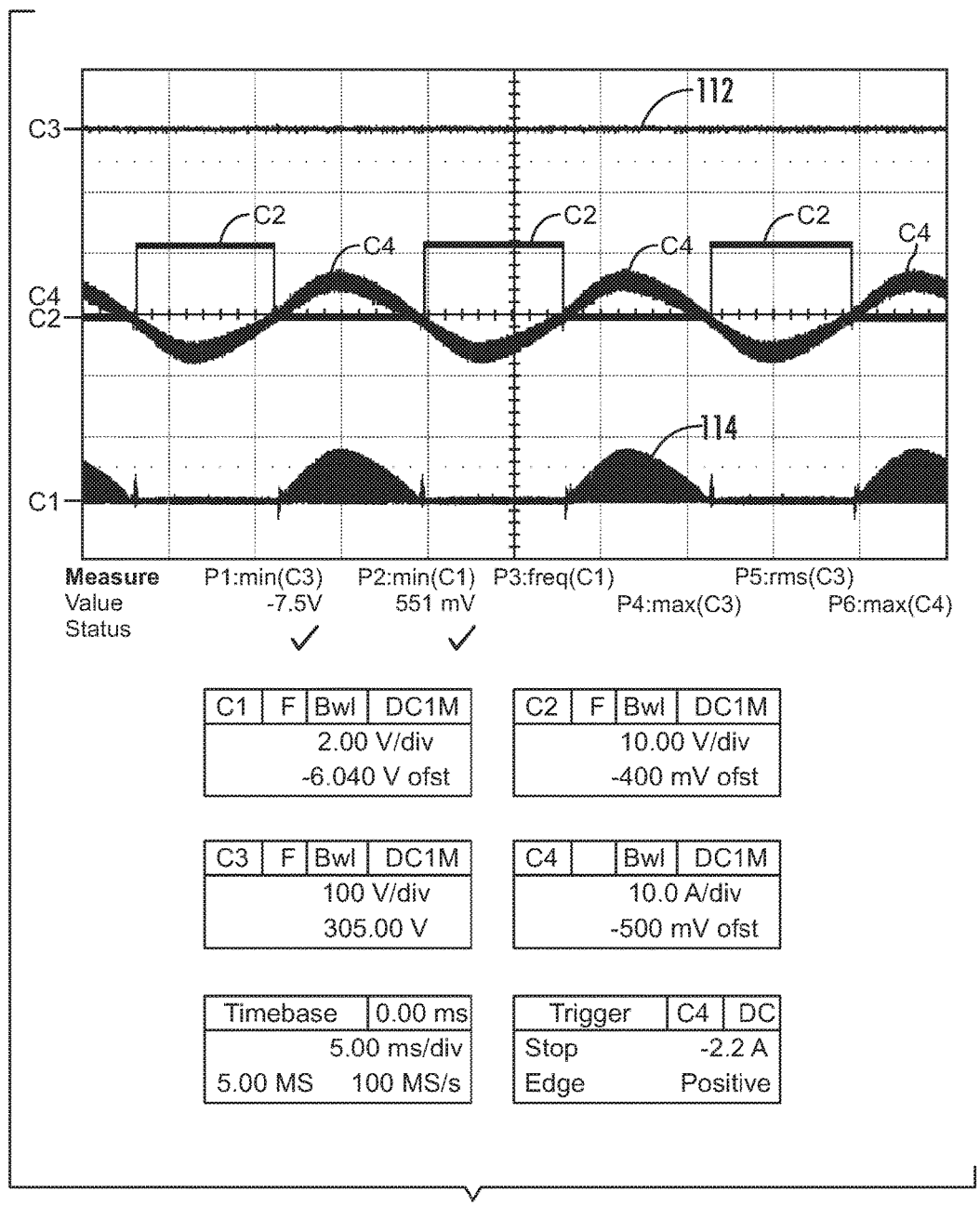
FIG. 11 is another waveform diagram representing input values and driver signals for the PFC totem-pole converter of FIG. 9.

In the waveform diagram of FIG. 11, the current sense signal CS1 is represented as C1; the PWM driver signal PWM_L for switching element Q4 is represented as C2; the voltage across the secondary winding for current sense transformer CT1 is represented as C3; and the current through the PFC inductor L1 is represented as C4.

Figure 9:
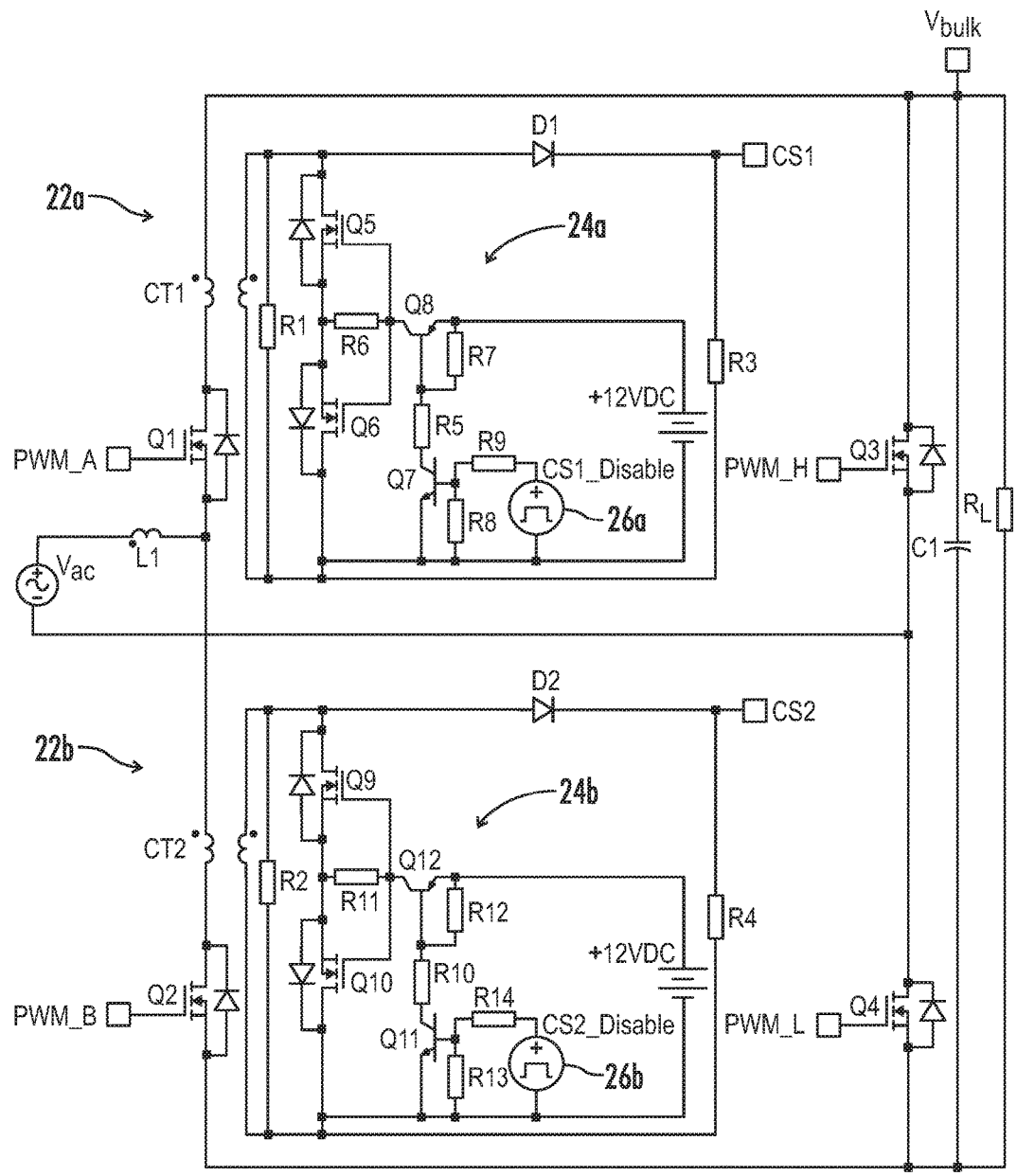
FIG. 9 is a circuit diagram representing an exemplary totem-pole PFC converter having current sense transformer with shunt switch circuit according to the embodiment of FIG. 8.

In contrast with the diagram shown in FIG. 5, one of skill in the art may observe from FIG. 11 that the totem-pole PFC of FIG. 9 produces a voltage across the current sense transformer secondary having relatively non-existent voltage stresses 112. Further, the current sense signal CS1 (C1) is provided without the unwanted signal components in association with the negative AC line cycle.

Figure 12:
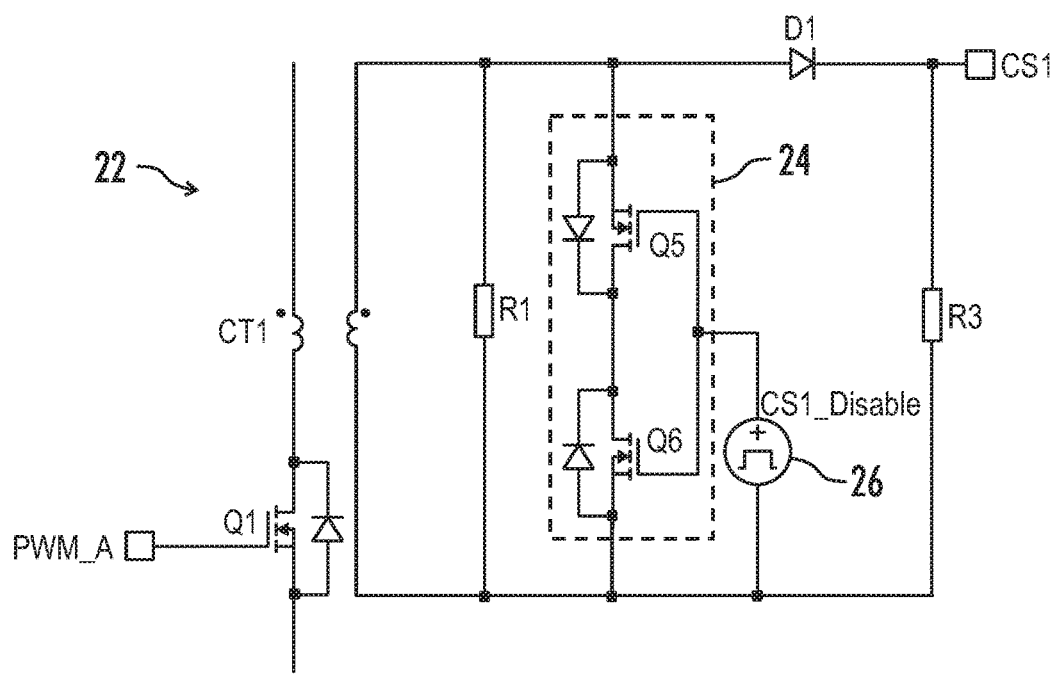
FIG. 12 is a circuit diagram representing another embodiment of a current sense transformer with shunt switch circuit as disclosed herein.

Referring next to FIG. 12, another embodiment of a current sense circuit 22 includes a shunt switch circuit 24 with switching elements Q5 and Q6 having a common drain connection. The gate terminals for each switching element Q5, Q6 are further commonly coupled to receive the disable signal. This configuration may however typically require a negative voltage to turn off both switching elements Q5, Q6.

Figure 13:
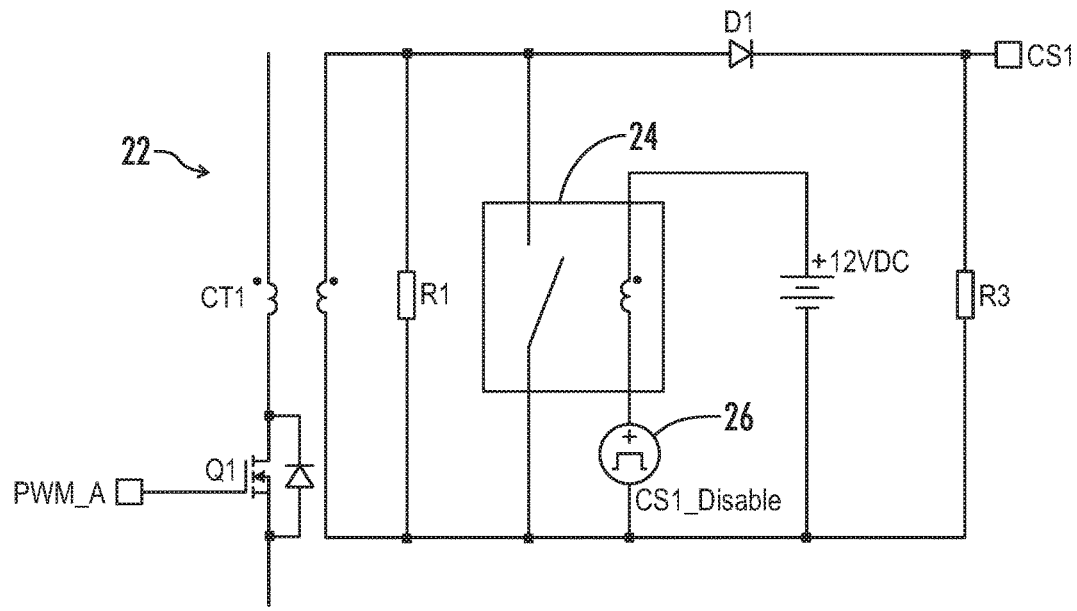
FIG. 13 is a circuit diagram representing another embodiment of a current sense transformer with shunt switch circuit as disclosed herein.

In another embodiment of a current sense circuit 22 as represented in FIG. 13, a fast response relay is used as the shunt switch 24, with a switching component being driven by an inductive component further coupled on a first end to a voltage source and on a second end to the disabling signal 26.

Figure 14:
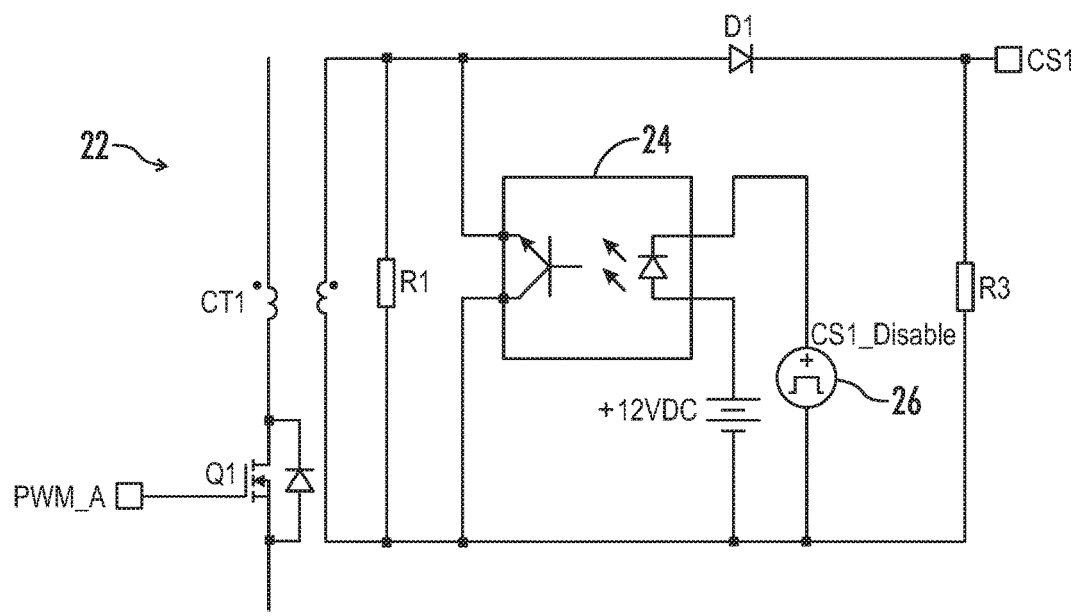
FIG. 14 is a circuit diagram representing another embodiment of a current sense transformer with shunt switch circuit as disclosed herein.

In another embodiment of a current sense circuit 22 as represented in FIG. 14, a high speed opto-coupler is used as the shunt switch 24. The photodetector is coupled across the reset resistor R1, with one end (e.g., cathode) for the light source being coupled to the disabling signal 26 and the other end (e.g., anode) being coupled to the voltage source.

Figure 15:
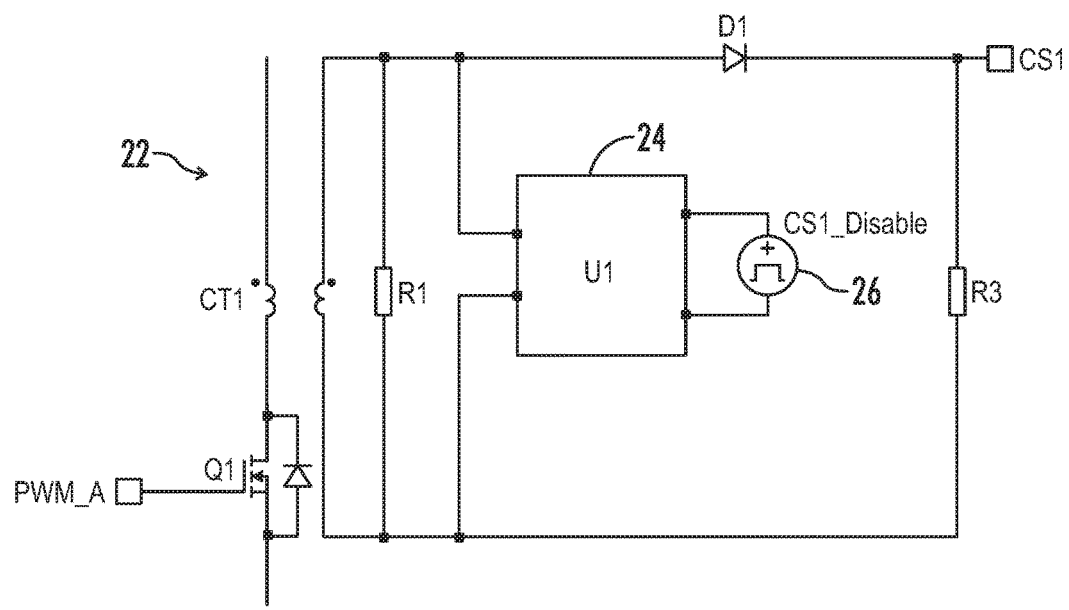
FIG. 15 is a circuit diagram representing another embodiment of a current sense transformer with shunt switch circuit as disclosed herein.

In another embodiment of a current sense circuit 22 as represented in FIG. 15, an integrated circuit (U1) is used as the shunt switch 24. For example, circuit components Q5, Q6, Q7, Q8, R5, R6, R7, R8 and R9 as previously referenced in FIG. 8 may be integrated into an IC.

While the totem-pole PFC as disclosed herein has been illustrated with respect to a single phase, it may within the scope of the present disclosure be applied for interleaved (e.g., multiphase) PFC configurations.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical connection between the connected items or an indirect connection through one or more passive or active intermediary devices. The term "circuit" means at least either a single component or a multiplicity of components, either active and/or passive, that are coupled together to provide a desired function. Terms such as "wire," "wiring," "line," "signal," "conductor," and "bus" may be used to refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

The terms "switching element" and "switch" may be used interchangeably and may refer herein to at least: a variety of transistors as known in the art (including but not limited to FET, BJT, IGBT, IGFET, etc.), a switching diode, a silicon controlled rectifier (SCR), a diode for alternating current (DIAC), a triode for alternating current (TRIAC), a mechanical single pole/double pole switch (SPDT), or electrical, solid state or reed relays. Where either a field effect transistor (FET) or a bipolar junction transistor (BJT) may be employed as an embodiment of a transistor, the scope of the terms "gate," "drain," and "source" includes "base," "collector," and "emitter," respectively, and vice-versa.

The terms "power converter" and "converter" unless otherwise defined with respect to a particular element may be used interchangeably herein and with reference to at least DC-DC, DC-AC, AC-DC, buck, buck-boost, boost, half-bridge, full-bridge, H-bridge or various other forms of power conversion or inversion as known to one of skill in the art.

Terms such as "providing," "processing," "supplying," "determining," "calculating" or the like may refer at least to an action of a computer system, computer program, signal processor, logic or alternative analog or digital electronic device that may be transformative of signals represented as physical quantities, whether automatically or manually initiated.

The terms "controller," "control circuit" and "control circuitry" as used herein may refer to, be embodied by or otherwise included within a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed and programmed to perform or cause the performance of the functions described herein. A general purpose processor can be a microprocessor, but in the alternative, the processor can be a microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A power converter comprising:
   a totem pole power factor correction circuit having at least a first leg with first and second switching elements coupled in series;
   an inductor coupled between an AC input on a first end and a node between the first and second switching elements on a second end; and
   a current sensing circuit comprising
      a first transformer winding coupled in series with the first switching element,
      a second transformer winding magnetically coupled to the first transformer winding and configured to deliver current from the first transformer winding to a current sense terminal during an active phase for the first switching element, and a shunt circuit comprising first and second shunt switches electrically coupled in series across the second transformer winding, and a controller configured to activate each of the first and second shunt switches and accordingly disable the current sensing circuit during the freewheeling phase for the first switching element, wherein the controller comprises a voltage source applied between a common source node for each of the first and second shunt switches and respective gate nodes for the first and second shunt switches.

2. The power converter of claim 1, wherein the active phase for the first switching element and the freewheeling phase for the second switching element correspond to a negative half cycle for the AC input, and wherein the active phase for the second switching element and the freewheeling phase for the first switching element correspond to a positive half cycle for the AC input.

3. The power converter of claim 1, wherein the first and second shunt switches are electrically coupled in series at a common source node, and respective gate terminals of the first and second shunt switches are coupled to a collector terminal for a third shunt switch, wherein a collector terminal of a fourth shunt switch is coupled to a base terminal of the third shunt switch and an emitter terminal of the fourth shunt switch is coupled to circuit ground, and the controller is configured to deliver control signals for activating a base terminal of the fourth shunt switch during the freewheeling phase for the first switching element, thereby further activating each of the first, second and third shunt switches.

4. The power converter of claim 3, wherein the first, second, third and fourth shunt switches are formed in an integrated circuit device.

5. The power converter of claim 1, wherein the first and second shunt switches are electrically coupled in series at a common drain node, and the controller is coupled between a circuit ground and respective gate terminals of the first and second shunt switches.

6. The power converter of claim 1, wherein the shunt switch comprises a relay driven by a coil coupled in series with the controller.

7. The power converter of claim 1, wherein the shunt switch comprises an opto-coupler having a sensor coupled across the second transformer winding and a source coupled to the controller.

8. The power converter of claim 1, wherein the current sensing circuit comprises a first current sensing circuit, wherein the power converter further comprises a second current sensing circuit comprising:

a third transformer winding coupled in series with the second switching element, a fourth transformer winding magnetically coupled to the third winding and configured to deliver current from the third winding to a current sense terminal during an active phase for the second switching element, and a second shunt circuit configured to disable the second current sensing circuit during a freewheeling phase for the second switching element.

9. A current sensing circuit for a power converter having a totem pole power factor correction (PFC) topology with at least a first leg comprising first and second PFC switches coupled in series between first and second output terminals, the current sensing circuit comprising, for each of the first and second PFC switches:

a primary winding for a current sensing transformer coupled in series with the respective PFC switch and having an active phase and a freewheeling phase;

a secondary winding for the current sensing transformer magnetically coupled to the primary winding;

a first shunt switch and a second shunt switch electrically coupled in series with each other at a common source node and further coupled across the secondary winding, wherein respective gate terminals of the first and second shunt switches are coupled to a collector terminal of a third shunt switch, and wherein a collector terminal of a fourth shunt switch is coupled to a base terminal for the third shunt switch and an emitter terminal of the fourth shunt switch is coupled to circuit ground; and a controller configured to turn off the first shunt switch during the active phase, wherein current is provided from the primary winding to a current sense terminal, turn on each of the first and second shunt switches during the freewheeling phase, wherein the transformer is shorted, and deliver control signals for activating a base terminal of the fourth shunt switch during the freewheeling phase, thereby further turning on each of the first, second and third shunt switches.

10. The current sensing circuit of claim 9, wherein the active phase corresponds to a negative half cycle for an AC input to the respective PFC switch, and wherein the freewheeling phase corresponds to a positive half cycle for the AC input.

11. The current sensing circuit of claim 9, wherein the controller comprises a voltage source applied between a common source node for each of the first and second shunt switches and respective gate nodes for the first and second shunt switches.

12. The current sensing circuit of claim 9, wherein the first, second, third and fourth shunt switches are formed in an integrated circuit device.

13. The current sensing circuit of claim 9, wherein the first and second shunt switches are electrically coupled in series at a common drain node, and the controller is coupled between a circuit ground and respective gate terminals of the first and second shunt switches.

14. A current sensing circuit for a power converter having a totem pole PFC topology, the current sensing circuit comprising:

a primary winding for a current sensing transformer coupled in series with a PFC switch and having an active phase and a freewheeling phase;

a secondary winding for the transformer magnetically coupled to the primary winding;

a first shunt switch and a second shunt switch electrically coupled in series with other at a common drain node, and across the secondary winding; and a controller coupled between a circuit ground and respective gate terminals for the first and second shunt switches, and configured to turn off the first shunt switch during the active phase, wherein current is provided from the primary winding to a current sense terminal, and to turn on each of the first and second shunt switches during the freewheeling phase, wherein the transformer is shorted.

15. The current sensing circuit of claim 14, wherein the active phase corresponds to a negative half cycle for an AC input to the PFC switch, and wherein the freewheeling phase corresponds to a positive half cycle for the AC input.

16. The current sensing circuit of claim 14, wherein the first, second, third and fourth shunt switches are formed in an integrated circuit device.

* * * * *